United States Patent
Schaeffer et al.

(10) Patent No.: US 7,132,360 B2
(45) Date of Patent: Nov. 7, 2006

(54) METHOD FOR TREATING A SEMICONDUCTOR SURFACE TO FORM A METAL-CONTAINING LAYER

(75) Inventors: James K. Schaeffer, Austin, TX (US); Darrell Roan, Austin, TX (US); Dina H. Triyoso, Austin, TX (US); Olubunmi O. Adetutu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 229 days.

(21) Appl. No.: 10/865,268

(22) Filed: Jun. 10, 2004

(65) Prior Publication Data

US 2005/0277294 A1    Dec. 15, 2005

(51) Int. Cl.
H01L 21/4763  (2006.01)
H01L 21/8344  (2006.01)
H01L 21/8242  (2006.01)
H01L 21/336   (2006.01)

(52) U.S. Cl. ............ 438/622; 438/240; 438/238; 438/381; 257/E21.29

(58) Field of Classification Search ............ 438/240, 438/238, 381
See application file for complete search history.

(56) References Cited

U.S. PATENT DOCUMENTS

| | | | |
|---|---|---|---|
| 5,939,150 A * | 8/1999 | Stelzle et al. | 427/558 |
| 6,503,330 B1 | 1/2003 | Sneh et al. | |
| 6,566,276 B1 * | 5/2003 | Maloney et al. | 438/758 |
| 6,660,660 B1 | 12/2003 | Haukka et al. | |
| 6,723,581 B1 | 4/2004 | Chabal et al. | |
| 6,737,313 B1 * | 5/2004 | Marsh et al. | 438/240 |
| 6,887,776 B1 * | 5/2005 | Shang et al. | 438/612 |

OTHER PUBLICATIONS

Toyoda, S. et al; "Effects of interlayer and annealing on chemical states of $HfO_2$ gate insulators studied by photoemission spectroscopy"; Applied Physics LetterS Mar. 29, 2004; pp. 2328-2330; vol. 84, No. 13, American Institute of Physics.

Alam, M.A. et al.; "Mathemetical description of atomic layer deposition and its application to the nucleation and growth of $HfO_2$ gate dielectric layers"; Journal of Applied Physics; Sep. 1, 2003; vol. 94, No. 5; American Institute of Physics.

Green, M.L. et al.; "Nucleation and growth of atomic layer deposited $HfO_2$ gate dielectric layers on chemical oxide (Si-O-H) and thermal oxide ($SiO_2$ or Si-O-N) underlayers"; Journal of Applied Physics; Dec. 15, 2002; vol. 92, No. 12; pp. 7168-7172; American Institute of Physics.

Conard, T. et al.; "TOF-SIMS as a rapid diagnostic tool to monitor the growth mode of thin (high k) films"; Applied Surface Science; 2003; pp. 400-403; Elsevier Science B.V.

* cited by examiner

*Primary Examiner*—Michael Lebentritt
*Assistant Examiner*—Elias Ullah
(74) *Attorney, Agent, or Firm*—Joanna G. Chiu; Robert L. King

(57) ABSTRACT

A method for treating a semiconductor surface to form a metal-containing layer includes providing a semiconductor substrate having an exposed surface. The exposed surface of the semiconductor substrate is treated by forming one or more metals overlying the semiconductor substrate but not completely covering the exposed surface of the semiconductor substrate. The one or more metals enhance nucleation for subsequent material growth. A metal-containing layer is formed on the exposed surface of the semiconductor substrate that has been treated. The treatment of the exposed surface of the semiconductor substrate assists the metal-containing layer to coalesce. In one embodiment, treatment of the exposed surface to enhance nucleation may be performed by spin-coating, atomic layer deposition (ALD), physical layer deposition (PVD), electroplating, or electroless plating. The one or more metals used to treat the exposed surface may include any rare earth or transition metal, such as, for example, hafnium, lanthanum, etc.

33 Claims, 2 Drawing Sheets

METHOD FOR TREATING A SEMICONDUCTOR SURFACE TO FORM A METAL-CONTAINING LAYER

FIELD OF THE INVENTION

This invention relates generally to semiconductor processing, and more specifically, to methods for treating a surface to form a metal-containing layer.

RELATED ART

Future generation semiconductor devices will require thin gate dielectric films having a high dielectric constant (K). One technique known today for forming these thin gate dielectric films is atomic layer deposition (ALD). However, if such thin films are formed using current ALD techniques, they are typically non-continuous until a substantial film thickness is reached, which requires a large number of ALD cycles. This poses a challenge to the scalability of thin gate dielectric films.

For example, FIG. 1 illustrates a semiconductor device 10 having a semiconductor substrate 12, an oxide layer 14 overlying semiconductor substrate 12, and a dielectric layer 29 overlying oxide layer 14. Semiconductor substrate 12 may be any kind of semiconductor substrate such as a silicon substrate. Oxide layer 14 may be formed using an SC2 clean, which includes hydrogen peroxide, hydrochloric acid, and water, to provide a substantially hydroxylated silicon-containing ($SiO_xH_y$) layer 14. Alternatively, oxide layer 14 may be grown or formed in other ways to provide the substantially hydroxylated silicon-containing layer. The formation of oxide layer 14 ($SiO_xH_y$) results in hydroxyl (OH) terminations which function as nucleation sites used for the subsequent deposition of a metal oxide layer. For example, referring to FIG. 1, nucleation sites 16, 18, 27, and 20 are formed. Subsequently, a metal oxide layer 29 is formed by ALD where deposition fronts 22–25 represent the formation of metal oxide layer 29 at different times, $t_1$–$t_4$, respectively. Since nucleation sites 16, 18, and 20 are spaced so far apart, such as, by a distance D1, note that a continuous film is not formed until time $t_4$, where deposition front 25 is the first growth front that is continuous over oxide layer 14. Note also that each deposition front may represent any number of actual ALD cycles. Furthermore, due to the sparseness of nucleation sites, at time $t_4$, voids 26 and 28 are still present, thus resulting in a non-planar surface which in turn may degrade device performance (e.g., higher leakage current). To achieve a more planar surface, an even greater number of ALD cycles is required, thus resulting in an even thicker film.

Also, note that many nucleation sites may remain unreacted, such as nucleation site 27 which does not react during subsequent ALD cycles. For example, referring to FIG. 2, an ALD precursor of hafnium tetrachloride ($HfCl_4$) is used which allows the hafnium to bond with some of the hydroxyl terminations, resulting in O—$HfCl_x$ at the exposed surface, where O is oxygen. However, note that the reactivity between the hafnium and the hydroxyl terminations of the $SiO_xH_y$ layer (i.e. layer 14) is such that it leaves some nucleation sites unreacted, such as the unreacted OH on the right side of the arrow in FIG. 2, thus resulting in unreacted sites such as unreacted nucleation site 27 of FIG. 1. Therefore, due to the sparseness of the nucleation sites, and the lack of reaction of a number of nucleation sites, further scalability of thin films becomes difficult.

In another method known today, the surface of a semiconductor substrate may be pretreated with a hydrofluoric (HF) clean to obtain hydrogen (H) terminations. However, the hydrogen terminations result in poor surface coverage during subsequent ALD cycles due to the absence of the more reactive hydroxyl terminations (OH). (Note that in this method, an oxide layer, such as oxide layer 14 of FIG. 1, may not be present between the ALD layer and the semiconductor substrate.) In yet another method known today, a thermally grown oxide layer (e.g. $SiO_2$) may be formed over the semiconductor substrate to provide a starting surface for ALD film deposition. However, this method also results in poor surface coverage. Therefore, these other known methods also result in many of the same problems with respect to nucleation sparseness, thickness, and unreacted nucleation sites as described above in reference to FIGS. 1 and 2, thus not allowing for further scalability of thin films.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Through the use of a metal treatment of an exposed surface, the reactivity of nucleation sites may be increased for the subsequent ALD formation of a metal-containing layer. In one embodiment, the metal treatment is performed so that a uniformly spaced distribution of nucleation sites results where each nucleation site has increased reactivity. This may allow for a thinner continuous metal-containing layer in which a reduced number of voids is formed. This may therefore allow for the ability to increase scalability, improve electrical properties, and reduce leakage of thin high K gate dielectrics.

Figure 3:
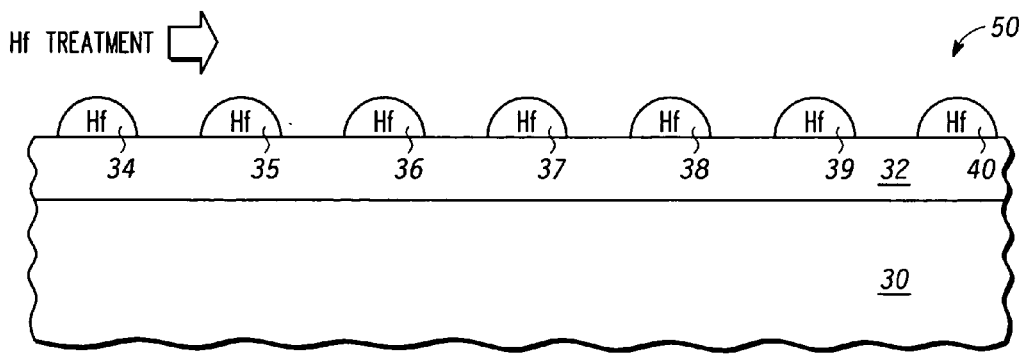
FIGS. 3 and 4 illustrate cross sectional views of a semiconductor device in accordance with one embodiment of the present invention.

Illustrated in FIG. 3 is a semiconductor device 50 in which nucleation sites are formed. In FIG. 3, a semiconductor substrate 30 is provided. In one form substrate 30 is a bulk semiconductor such as silicon, silicon germanium, or germanium, but any of various semiconductor materials may be used to implement substrate 30. Alternatively, substrate 30 may be implemented as a silicon-on-insulator (SOI) substrate. Overlying substrate 30 is a dielectric layer 32. In one embodiment, dielectric layer 32 is an oxide layer, and therefore, may be referred to as oxide layer 32. Alternatively, other dielectrics may be used to form dielectric layer 32. In one form, oxide layer 32 is a silicon dioxide ($SiO_2$) layer formed by the chemical cleaning of silicon substrate 30 which results in a chemical oxide or a native oxide formed on silicon substrate 30. In one embodiment, the cleaning is performed using SC2, which is a solution including hydrogen peroxide, water, and hydrochloric acid. Other conventional forms of formation may be used such as thermal growth followed by an etch-back, if desired, to achieve a thinner oxide layer. Note that in alternate embodiments, dielectric layer 32 may not be present.

After formation of dielectric layer 32, the exposed surface of semiconductor device 50 is treated to form nucleation sites 34–40. In the illustrated embodiment, the exposed surface is treated with hafnium to form nucleation sites which include hafnium hydroxyl ($HfO_xH_y$) terminations which will be used in the subsequent ALD formation of a metal-containing layer. In one embodiment, as described above, dielectric layer 32 may be formed by thermally growing silicon dioxide ($SiO_2$) and, optionally, subsequently etching back the grown silicon dioxide to a predetermined thickness. In this embodiment, the resulting dielectric layer 32 is a substantially hydroxyl terminated $SiO_2$ layer, where nucleation sites 34–40 are formed on this substantially hydroxyl terminated $SiO_2$ layer. Alternatively, dielectric layer 32 may not be present. In this embodiment, the exposed surface of substrate 30 may be prepared or pretreated with a hydrofluoric (HF) clean prior to formation of nucleation sites 34–40 directly on the exposed pretreated surface of substrate 30, where the HF clean results in a substantially hydrogen terminated substrate 30. Therefore, depending on the presence of dielectric layer 32, nucleation sites 34–40 may be formed on dielectric layer 32 or directly on substrate 30. Note that, as used herein, the exposed surface of the substrate that is to be treated may refer to the exposed surface of dielectric layer 32 (or any other upper most layer that is to be treated) or, if dielectric layer 32 is not present, then the exposed surface of the substrate may refer to the exposed surface of substrate 30.

In one embodiment, at the treated surface, the Hf treatment results in a sub-monolayer of hafnium. In one embodiment, the Hf treatment results in a single atomic thickness layer in at least a portion of the exposed treated surface. In one embodiment, after the Hf treatment, the Hf does not completely cover the exposed surface, such that portions of the treated surface may remain exposed. Also, as will be described in more detail below, note that other rare earth or transition metals may be used to treat the exposed surface of the substrate rather than or in addition to hafnium. Therefore, the descriptions provided herein for hafnium also apply to these other metals. Also, in one embodiment, nucleation sites 34–40 do not include silicon.

Still referring to FIG. 3, the hafnium treatment may be performed in a variety of ways. Note that the descriptions which follow for the various different hafnium treatments may apply for treatments using any rare earth or transition metal, such as, for example, lanthanum, yttrium, titanium, tantalum, zirconium, etc. However, for ease of explanation, the following descriptions will be described in reference to a hafnium treatment.

In one embodiment, the hafnium treatment may be performed using a spin-coating process in which hafnium metals are dissolved within a solvent and are spun onto the exposed surface of device 50 (which may be the surface of dielectric layer 32, if present, or the surface of substrate 30 if dielectric layer 32 is not present). In one embodiment, hafnium halides may be dissolved in water for the spin-on process. The spin-on process results in metal hydroxyl ($MO_xH_y$) terminations at the treated surface (in which M may include any number of metals). As will be described below in reference to FIG. 5, these metal hydroxyl terminations result in an increased number of reactive nucleation sites due to their increased reactivity to the subsequent ALD precursor.

In another embodiment, the hafnium treatment may be performed using ALD of a metal layer. For example, an ALD of hafnium metal may be used to result in the hafnium hydroxyl terminations at the treated surface. The ALD process may be performed with or without plasma, and if plasma is used, the plasma may be direct or indirect. Furthermore, the ALD of a metal may be performed using hydrogen as the reducing agent. Note that if dielectric layer 32 is not present and the substrate 30 is hydrogen terminated (as a result of an HF clean, for example), water may be flowed into the reaction chamber subsequent to hafnium treatment in order to form hafnium hydroxyl terminations. In yet another embodiment, the hafnium treatment may be performed by using a chemical vapor deposition (CVD) of hafnium metal to result in the hafnium hydroxyl terminations at the treated surface. During the CVD, a metal precursor (such as a hafnium-containing precursor) is flowed through the CVD reaction chamber using a carrier gas such as, for example, argon, ammonia, and nitrogen. Alternatively, the CVD may be performed with direct or indirect plasma.

In yet another alternate embodiment, the hafnium treatment may be performed using electroplating or electroless plating of hafnium, using the appropriate chemistry, onto the surface to be treated. For example, during the plating, Hf or other metallic ion solutions ($M^{2+}$) may be used, with a reducing agent such as hypophosphite or aminoborane. In yet another alternate embodiment, the hafnium treatment may be performed using physical vapor deposition (PVD) of hafnium metal to result in the hafnium hydroxyl terminations at the treated surface. In one embodiment, the PVD is performed at low power (such as less than approximately 50 Watts), at low temperature (such as less than approximately 100 degrees Celsius), and at a high pressure (such as, for example, greater than approximately 10 mTorr).

Figure 1:
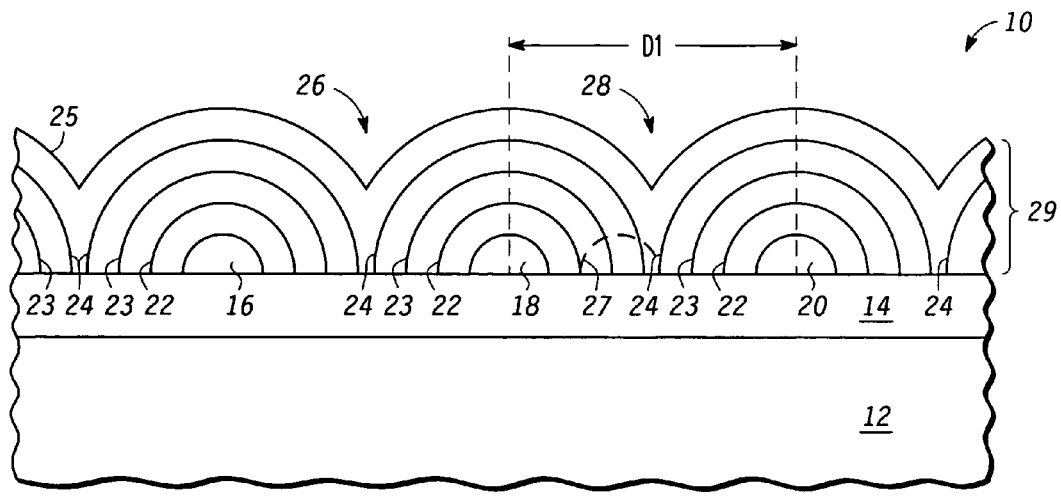
FIG. 1 illustrates a cross sectional view of a semiconductor device in accordance with a prior art method.
Figure 2:
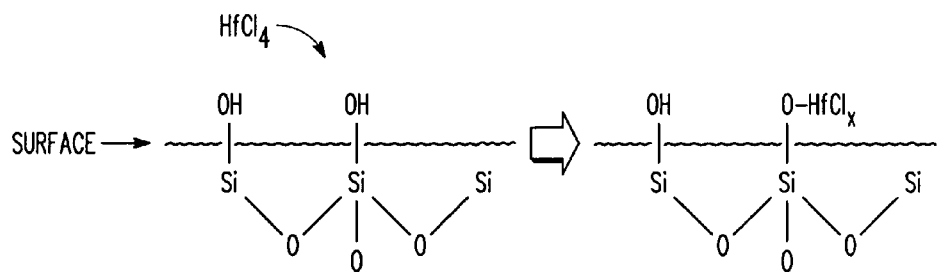
FIG. 2 illustrates a chemical representation in accordance with the prior art method.
Figure 4:
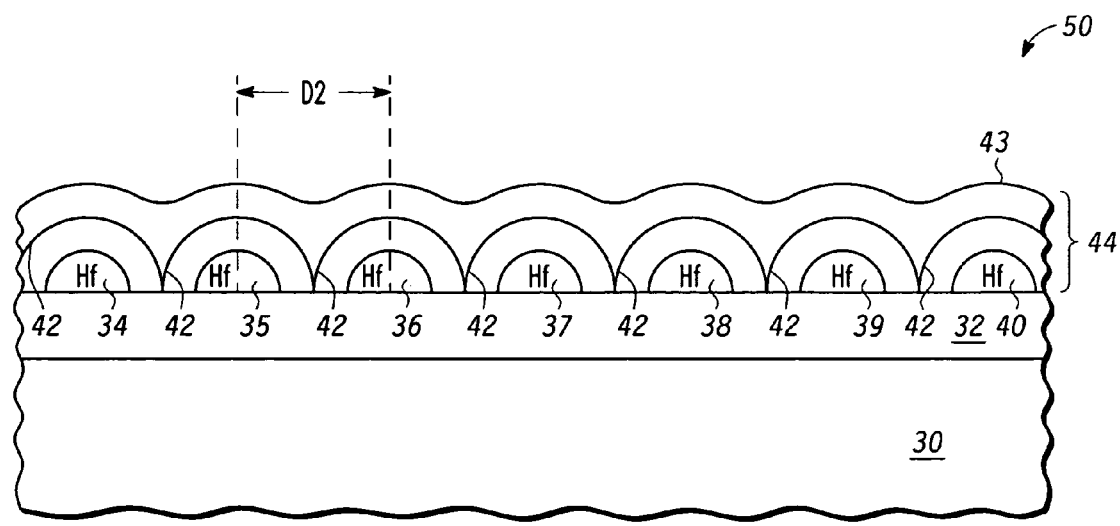

FIG. 4 illustrates semiconductor device 50 after ALD formation of a metal-containing layer 44. FIG. 4 illustrates deposition fronts 42 and 43 which correspond to times $t_1$ and $t_2$, respectively, during ALD formation of metal-containing layer 44. Note that each deposition front 42 and 43 may correspond to any number of actual ALD cycles. However, note that the density of nucleation sites is greater as compared to those previously achievable, as was discussed above in reference to FIG. 1. That is, a larger number of reactive nucleation sites per area is present in FIG. 4 as compared to FIG. 1. Furthermore, the distance D2 between nucleation sites in FIG. 4 is smaller as compared to the distance D1 between nucleation sites in FIG. 1. Note that deposition front 43 of metal-containing layer 44 is continuous over nucleation sites 34–40. In one embodiment, in which metal-containing layer 44 is hafnium dioxide ($HfO_2$), this continuous metal-containing layer 44 may be achieved in less than approximately 40 ALD cycles, or alternatively, less than approximately 20 ALD cycles. In another embodiment, full coverage of hafnium dioxide may be achieved in less than 15 cycles, or more preferably, less than 10 cycles. In one embodiment, growth of hafnium dioxide is approximately 0.5 Ångstroms per ALD cycle. Therefore, metal-containing layer 44 coalesces within a predetermined number of ALD cycles where this predetermined number may be less than the number of ALD cycles required for coalescence using prior art methods, such as those described above in reference to FIGS. 1 and 2.

Thus, a continuous metal-containing layer may be achieved in less time as compared to the prior art methods described above in reference to FIG. 1. For example, $t_2$ of deposition front 43 of FIG. 4 occurs sooner with respect to the start of the ALD deposition of layer 44 than $t_4$ of deposition front 25 of FIG. 1 with respect to the start of the ALD deposition of layer 29. (The time from the start of ALD deposition of layer 44 to $t_4$ may also be referred to as the formation time for metal-containing layer 44. That is, the formation time may refer to the time it takes for metal-containing layer 44 to be continuous.) Also, note that metal-containing layer 44, at deposition front 43, is fairly planar. That is, substantial planarity may be achieved in fewer ALD cycles, and the resulting metal-containing layer 44 may be thinner as compared to prior art methods. Furthermore, the improved planarity also allows for fewer voids (such as voids 26 and 28) to be formed. In one embodiment, a thickness of the resulting metal-containing layer 44 is at most 20 Ångstroms, or alternatively, at most 10 Ångstroms, or alternatively, at most 5 Ångstroms. In one embodiment, after formation of metal-containing layer 44, an anneal may be performed to improve the leakage characteristics and other electrical properties of metal-containing layer 44.

Figure 5:
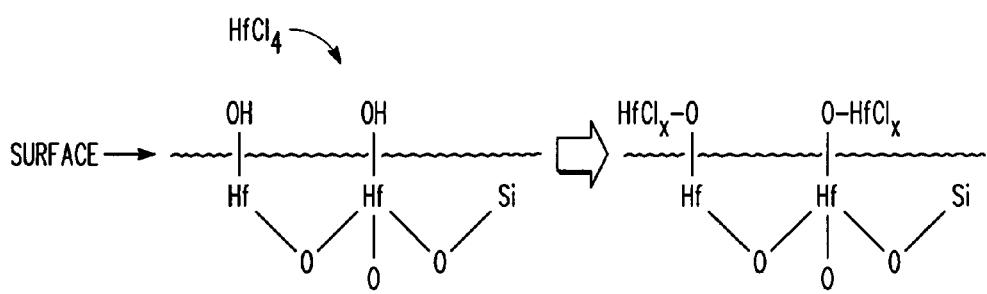
FIG. 5 illustrates a chemical representation in accordance with one embodiment of the present invention.

FIG. 5 illustrates a chemical representation of hafnium hydroxyl formation. Note that the chemical representation of FIG. 5 is only a basic representation to illustrate the basic concepts, and is not intended to be fully detailed. Note that after formation of nucleation sites, hafnium hydroxyl terminations are formed at the surface. For example, in FIG. 5, hafnium atoms are bonded to oxygen atoms with a hydroxyl termination at the surface. Note that the Hf atoms may correspond to the schematic representation of the nucleation sites of FIG. 3. During the subsequent application of the ALD precursor hafnium tetrachloride ($HfCl_4$), the metal hydroxyls (i.e. the hafnium hydroxyls) have a greater affinity or reactivity with $HfCl_4$. That is, hafnium hydroxyls are more energetically favorable to the hafnium precursor as compared to silicon hydroxyls. Therefore, as can be seen on the right of the arrow in FIG. 5, more nucleation sites are reactive, leaving a reduced number of unreacted sites, if any, as compared to the unreacted sites left with silicon hydroxyls discussed above in reference to FIG. 2. In one embodiment, the number of metal atoms (such as hafnium atoms) at the treated surface are substantially uniformly distributed at an areal density of $1\times10^{14}/cm^2$ to $5\times10^{15}/cm^2$, where the formation of such metallic atoms on the exposed surface assist in subsequent material growth. Note that during the treatment of the surface with a metal such as hafnium, some silicon atoms may remain at the surface from the oxide layer or semiconductor substrate. Alternatively, atoms from other underlying layers (such as Ge from a germanium substrate) may be present at the surface. Therefore, the ability to achieve a continuous metal-containing layer 44 in a reduced amount of ALD cycles and the reduction of unreacted nucleation sites may allow for thinner high dielectric constant gate dielectrics.

In one embodiment, metal-containing layer 44 may be any metal oxide layer, such as, for example, hafnium dioxide, lanthanum oxide, yttrium oxide, titanium oxide, tantalum oxide, or an oxide having other rare earth metals or transition metals. The metal oxide may also include any number of metals, such as, for example, hafnium aluminum oxide, other metal aluminates, etc. Alternatively, metal-containing layer 44 may be any metal silicate layer, such as, for example, hafnium silicate, lanthanum silicate, and any other silicates having other rare earth metals or transition metals. Therefore, the use of a metal may enhance nucleation for subsequent metal-containing layer growth through the formation of metal hydroxyl terminations at the treated surface, as described in reference to FIG. 5. Therefore, note that the description of FIG. 5 applies to any rare earth or transition metal hydroxyls. Additionally, the metal hydroxyls may actually include any number of metals and generally exclude silicon. Note that in one embodiment, a first metal may be used to treat the surface, thus resulting in first metal hydroxyl terminations while a second metal (different from the first metal) may be formed by ALD using the first metal hydroxyl terminations to enhance nucleation. For example, hafnium hydroxyl terminations may be used as nucleation sites for the ALD formation of lanthanum oxide.

By now it should be appreciated that there has been provided various methods for treating an exposed surface of a semiconductor device with at least one metal to form reactive nucleation sites used in the subsequent ALD formation of a metal-containing layer. The treatment may result in a larger number of reactive nucleation sites as compared to previous methods. Furthermore, these nucleation sites include metal hydroxyls which are more reactive during subsequent ALD formation as compared to silicon hydroxyls. In one embodiment, the treatment of the exposed surface with a metal may allow for the formation of continuous ultra thin metal-containing films (such as, for example, less than 40, 30, 20 10, or even 5 Ångstroms). These continuous ultra thin metal-containing films may also be more planar which may result in improved electrical properties. Also, the ability to form continuous ultra-thin films may also increase the further scalability of gate dielectrics. The continuous ultra thin metal-containing film may also allow for the formation of fewer voids.

One embodiment of the present invention relates to a method which includes providing a semiconductor substrate having an exposed surface, treating the exposed surface of the semiconductor substrate by forming one or more metals overlying the semiconductor substrate but not completely covering the exposed surface of the semiconductor substrate where the one or more metals enhancing nucleation for subsequent material growth, and forming a metal-containing layer on the exposed surface of the semiconductor substrate that has been treated, wherein treatment of the exposed surface of the semiconductor substrate assists the metal-containing layer to coalesce.

Another embodiment relates to a method including providing a semiconductor substrate having an exposed surface, treating the exposed surface of the semiconductor substrate with one or more metals to form a substantially uniform distribution of metal atoms of areal density greater than $1\times10^{14}/cm2$ and less than $5\times10^{15}/cm2$ on the exposed surface where the one or more metals enhancing nucleation for subsequent material growth, and forming a metal-containing layer on the exposed surface of the semiconductor substrate that has been treated, the one or more metals assisting the metal-containing layer to completely cover the semiconductor substrate within a predetermined amount of formation time.

Yet another embodiment relates to a method including providing a substrate, providing a dielectric layer overlying the substrate, treating an exposed surface of the dielectric layer by forming a plurality of metallic atoms on the exposed surface where the plurality of metallic atoms assisting in subsequent material growth on the dielectric layer and where a portion of the dielectric layer remains exposed after the treating, and forming a metal-containing layer overlying the dielectric layer and the plurality of metallic atoms, the metal-containing layer using the plurality of metallic atoms to obtain complete surface coverage with metal of the dielectric layer.

In the foregoing specification, the invention has been described with reference to specific embodiments. However, one of ordinary skill in the art appreciates that various modifications and changes can be made without departing from the scope of the present invention as set forth in the claims below. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. Accordingly, the specification and figures are to be regarded in an illustrative rather than a restrictive sense, and all such modifications are intended to be included within the scope of the present invention.

What is claimed is:

1. A method comprising:
   providing a semiconductor substrate having an exposed surface;
   treating the exposed surface of the semiconductor substrate by forming one or more metals overlying the semiconductor substrate but not completely covering the exposed surface of the semiconductor substrate, the one or more metals enhancing nucleation for subsequent material growth; and
   forming a continuous metal-containing layer on the exposed surface of the semiconductor substrate and over the one or more metals, wherein treatment of the exposed surface of the semiconductor substrate assists the continuous metal-containing layer to coalesce.

2. The method of claim 1 wherein treating the exposed surface of the semiconductor substrate further comprises:
   treating the exposed surface by using a spin-on solution where the one or more metals are dissolved.

3. The method of claim 2 further comprising using a spin-on solution that is formed by dissolving at least one metal-containing precursor into a solvent.

4. The method of claim 3 wherein the solvent is water and the at least one metal-containing precursor is a metal halide.

5. The method of claim 2 wherein a spun-on metal results in a metal hydroxyl (MOxHy) termination on the exposed surface of the semiconductor substrate.

6. The method of claim 1 wherein treating the exposed surface of the semiconductor substrate further comprises:
   treating the exposed surface of the semiconductor substrate with one or more metals by using an atomic layer deposition (ALD).

7. The method of claim 1 wherein treating the exposed surface of the semiconductor substrate further comprises:
   treating the exposed surface of the semiconductor substrate with one or more metals by using at least one metal-containing precursor in a chemical vapor deposition.

8. The method of claim 1 wherein treating the exposed surface of the semiconductor substrate further comprises:
   plating to form the one or metals on the exposed surface of the semiconductor substrate.

9. The method of claim 8 wherein the plating further comprises:
   electroplating or electroless plating of the one or more metals.

10. The method of claim 1 wherein treating the exposed surface of the semiconductor substrate further comprises depositing the one or metals by physical vapor deposition (PVD).

11. The method of claim 1 wherein forming the metal-containing layer is a deposition of at least one of a metal oxide, a metal silicate or a metal aluminate.

12. The method of claim 1 wherein treating the exposed surface of the semiconductor substrate with one or more metals to form sites of no greater than a single atomic thickness further comprises treating the exposed surface of the semiconductor substrate with hafnium.

13. The method of claim 1 wherein treating the exposed portion of the semiconductor substrate with one or more metals further comprises forming one or more metals of no greater than a single atomic thickness in at least a portion of the exposed surface.

14. The method of claim 1 further comprising:
    processing the exposed surface of the semiconductor substrate prior to said treating to: (1) leave the exposed surface with a substantially hydrogen terminated surface; (2) leave the exposed surface with a substantially hydroxyl terminated surface; (3) thermally grow a silicon oxide layer of a predetermined thickness on the exposed surface of the semiconductor substrate; or (4) thermally grow a silicon oxide layer and etch back the silicon oxide layer to a predetermined thickness on the exposed surface of the semiconductor substrate.

15. The method of claim 1, further comprising:
    annealing the metal-containing layer.

16. A method comprising:
    providing a semiconductor substrate having an exposed surface;
    treating the exposed surface of the semiconductor substrate with one or more metals to form a substantially uniform distribution of metal atoms of areal density greater than $1 \times 10^{14}/cm^2$ and less than $5 \times 10^{15}/cm^2$ on the exposed surface, the one or more metals enhancing nucleation for subsequent material growth; and
    forming a continuous metal-containing layer on the exposed surface of the semiconductor substrate and over the one or more metals, the one or more metals assisting the continuous metal-containing layer to completely cover the semiconductor substrate within a predetermined amount of formation time.

17. The method of claim 16 wherein treating the exposed surface of the semiconductor substrate further comprises:
    treating the exposed surface by using a spin-on solution where the one or more metals are dissolved.

18. The method of claim 16 further comprising using a spin-on solution that is formed by dissolving at least one metal-containing precursor into a solvent.

19. The method of claim 18 wherein the solvent is water and the at least one metal-containing precursor is a metal halide.

20. The method of claim 16 wherein a spun-on metal results in a metal hydroxyl (MOxHy) termination on the exposed surface of the semiconductor substrate.

21. The method of claim 16 wherein treating the exposed surface of the semiconductor substrate further comprises:
treating the exposed surface of the semiconductor substrate with one or more metals by using an atomic layer deposition (ALD).

22. The method of claim 16 wherein treating the exposed surface of the semiconductor substrate further comprises:
treating the exposed surface of the semiconductor substrate with one or more metals by using at least one metal-containing precursor in a chemical vapor deposition.

23. The method of claim 16 wherein treating the exposed surface of the semiconductor substrate further comprises:
plating to form the one or more metals on the exposed surface of the semiconductor substrate.

24. The method of claim 23 wherein the plating further comprises: electroplating or electroless plating of the one or more metals.

25. The method of claim 16 wherein treating the exposed surface of the semiconductor substrate further comprises depositing the one or metals by physical vapor deposition (PVD).

26. The method of claim 16 wherein forming the metal-containing layer by forming at least one of a metal oxide, a metal silicate or a metal aluminate.

27. The method of claim 16 wherein treating the exposed surface of the semiconductor substrate with one or more metals to form sites of no greater than a single atomic thickness further comprises treating the exposed surface of the semiconductor substrate with hafnium.

28. The method of claim 16 further comprising:
forming the metal-containing layer by one of atomic layer deposition (ALD) or chemical vapor deposition (CVD).

29. The method of claim 16 further comprising:
forming a dielectric layer on the semiconductor substrate prior to the treating; and
etching a portion of the dielectric layer prior to forming the metal-containing layer to remove any oxide from the exposed surface of the substrate.

30. The method of claim 16 further comprising: thermally growing a surface oxide on the substrate prior to forming the metal-containing layer.

31. The method of claim 16 further comprising:
annealing the metal-containing layer.

32. A method comprising:
providing a substrate;
providing a dielectric layer overlying the substrate;
treating an exposed surface of the dielectric layer by forming a plurality of metallic atoms on the exposed surface, the plurality of metallic atoms assisting in subsequent material growth on the dielectric layer, wherein a portion of the dielectric layer remains exposed after the treating; and
forming a metal-containing layer overlying the dielectric layer and the plurality of metallic atoms, the metal-containing layer using the plurality of metallic atoms to obtain complete surface coverage with metal of the dielectric layer.

33. The method of claim 32 further comprising:
treating the exposed surface of the dielectric layer by spinning on hafnium oxide onto the exposed surface of the dielectric layer.

* * * * *